United States Patent [19]
Yan

[11] Patent Number: 6,025,988
[45] Date of Patent: Feb. 15, 2000

[54] INTERCONNECT ADAPTER AND HEAD SUSPENSION ASSEMBLY

[75] Inventor: Yan Yan, San Jose, Calif.

[73] Assignee: Read-Rite Corporation, Milpitas, Calif.

[21] Appl. No.: 09/213,472

[22] Filed: Dec. 17, 1998

[51] Int. Cl.[7] .................................................. H05K 63/30
[52] U.S. Cl. ........................ 361/685; 361/685; 361/686; 360/103; 360/104
[58] Field of Search ..................................... 361/685, 684, 361/686, 809, 749, 751; 360/104, 75, 97, 103

[56] References Cited

U.S. PATENT DOCUMENTS

| | | | |
|---|---|---|---|
| 5,495,377 | 2/1996 | Kim | 360/106 |
| 5,499,161 | 3/1996 | Hosseinzadeh et al. | 361/749 |
| 5,541,788 | 7/1996 | Ishida et al. | 360/98.01 |
| 5,737,152 | 4/1998 | Balakrishnan | 360/104 |
| 5,754,368 | 5/1998 | Shiraishi et al. | 360/104 |
| 5,757,585 | 5/1998 | Aoyagi et al. | 360/104 |
| 5,796,552 | 8/1998 | Akin, Jr. et al. | 360/104 |
| 5,812,344 | 9/1998 | Balakrishnan | 360/104 |
| 5,892,637 | 4/1999 | Brooks, Jr. et al. | 360/104 |
| 5,924,187 | 7/1999 | Matz | 29/603.03 |

*Primary Examiner*—Leo P. Picard
*Assistant Examiner*—David Foster
*Attorney, Agent, or Firm*—Nathan N. Kallman

[57] ABSTRACT

In a disk drive, an interconnect adapter for coupling a head of a suspension assembly to front-end read/write circuitry includes a pad set with a plurality of specially designed pads. The pads are formed with an integrated frame and multiple tabs. The tabs enable removal and replacement of the pad set from the suspension assembly to enable suspension assembly rework. The interconnect adapter is designed to adapt to polarity specifications of various head and read/write circuitry designs. The pad set design is configured for connection with a variety of traces, with a piezoelectric microactuator, pre-amplification circuitry, and any of a variety of heads.

20 Claims, 8 Drawing Sheets

INTERCONNECT ADAPTER AND HEAD SUSPENSION ASSEMBLY

FIELD OF THE INVENTION

The present invention pertains to hard disk drives, and in particular to interconnect adapters for a head suspension assembly.

BACKGROUND OF THE INVENTION

Conventional hard disk drives are the most widely used devices for data storage today. Some disk drives typically operate with two or more spinning disks and a pivoting head stack assembly (HSA). The HSA has multiple actuator arms. Attached to one end of each actuator arm are one or two suspension assemblies. Each suspension assembly includes a load beam, a flexure, and a slider. The flexure attaches the slider to the load beam. The slider carries a read/write transducer (i.e. head) for reading data from and writing data to the spinning disks.

An electromagnetic actuator such as a voice coil motor, controls movement of the HSA. During operation of the disk drive, the actuator moves the HSA and heads to selected disk tracks to access or store data.

Data storage density is measured in bits per unit area of a storage surface. Increases in data storage density has been achieved by a combination of increased track density (increasing the number of tracks per inch along the radius of the disk) and increased linear bit density (increasing the number of bits written along a track).

High precision actuators are now required to move the read/write head between the increasingly closely spaced data tracks. One promising approach is a dual-stage servo system, which uses a conventional voice coil motor as a primary (coarse low-bandwidth) actuator, and a piezoelectric micro-actuator as a secondary (fine high-bandwidth) actuator. High precision actuators, combined with improved head technology have enabled higher data transfer rates and higher storage density.

Higher data transfer rates, however, require increased bandwidth for transmitting read and write signals between the head and the front-end electronics of the disk drive. The bandwidth of a magnetic data storage device depends on the components in the recording channel, i.e. the electronics, interconnects, heads and recording media.

One limitation to increased bandwidth is signal noise. Particularly, the signal-to-noise ratio for data communicated by head leads on the load beam may not be optimized for additional data throughput. U.S. Pat. No. 5,055,969 to Putnam, for example, attempts to optimize the signal-to-noise ratio by placing a signal amplifier closer to the heads. More particularly, Putnam places an amplifier on the actuator arm. Accordingly, signals are pre-amplified prior to communication along the actuator arm. This optimizes the signal-to-noise ratio and enables increased throughput to the front-end read/write circuitry of the disk drive.

Another development in the effort to increase bandwidth is placing split pre-amplification circuitry on the load beam. This further optimizes the signal-to-noise ratio. Split pre-amplification circuitry divides standard read/write circuitry mounted on a head stack assembly into two or more sections including a mother chip and at least one daughter chip mounted on the suspension assembly. The daughter chips permanently couple with head traces and may perform any of a number of functions including signal amplification.

One drawback to making a coupling of the split pre-amplification circuitry, and other circuitry coupled to the suspension assembly, is that the suspension assembly may need to be removed from the actuator arm and reworked during assembly. Rework is routinely employed to precisely align the heads, assure targeted gram loads, meet flying height specifications, fix electrically defective heads, and/or replace mechanically defective components. Removal of the suspension assembly can result in a perfectly good split pre-amplification chip being discarded. Rejecting perfectly functional components is wasteful. What is desired is a way of rejecting only defective components and a way of preserving functional components during suspension assembly and HSA assembly.

Disk drive assembly includes other problems stemming from the non-compatibility of various head lead polarity and lead layouts with read/write circuitry configurations. Some sliders have four bonding pads. Two bonding pads couple with a read sensor of the head and two bonding pads couple with a write element of the head. An interconnect bonds to the slider bonding pads. The interconnect has two write traces and two read traces. Each read trace has a predetermined polarity, as does each write trace. The polarity of these head traces must be compatible with the read/write circuitry interface to enable the traces to couple with either a split signal pre-amplification circuit, or with the front-end read/write circuitry when a split pre-amplification circuit is not required.

Polarity compatibility between the heads and the read/write circuitry is critical for hard disk drive electronics. Head design and read/write circuitry design are often accomplished independently, possibly by different companies. This may result in polarity discrepancies and configuration variances between the two connection members. Electrical and magnetic testing are performed on a suspension assembly during assembly. Each test requires set-up (both hardware and software). The set-up configuration depends on the polarity of the read/write head to be tested. What is desired a universal-testing set-up that can be used on any suspension assembly regardless of the head polarity configuration.

SUMMARY OF THE INVENTION

An object of this invention is to provide an adapter for interconnecting heads and read/write circuitry with varied polarity configurations and layouts.

Another object of this invention is to provide an improved way of interconnecting standard read/write circuitry with any number of head configurations.

According to this invention, an interconnect adapter is provided for coupling read/write circuitry with a head suspension assembly. The suspension assembly includes a suspension with a slider having a head assembly attached at one end. The interconnect adapter attaches to the suspension and transmits signals from the head assembly to front-end read/write circuitry. The interconnect adapter is particularly useful for interconnecting a head assembly with a piezo-electric actuator, for interconnecting a head assembly with signal pre-amplifier circuitry, and for interconnecting a head assembly with head test circuitry.

Commercially available wireless suspensions have various pad configurations as well as head polarity characteristics. The interconnect adapter of the present invention is configurable to adapt commercially available heads with any of a variety of commercially available read/write circuitry elements regardless of the polarity discrepancies between the head and read/write circuitry. Accordingly, a universal testing set-up for any suspension assembly can be used because the interconnect adapter yields a standardized tail termination. While many advantages exist for the present invention, one ideal advantage is that the interconnect adapter may promote standardization of read/write IC designs so that a single version of commercially available read/write circuitry could be devised to accommodate any head polarity.

The interconnect adapter of this invention is readily removable and replaceable to enable rework of the suspension assembly. Accordingly, any of a number of commercially available control chips, heads and piezoelectric microactuators may be used in a disk drive because the interconnect adapter serves as an adapter to link these devices. Additionally, the interconnect adapter is adaptable for use with suspensions having piezoelectric microactuators and other microactuator types.

According to one aspect of the invention, the interconnect adapter includes signal pre-amplifier circuitry. Preferably, the pre-amplifier circuitry includes an IC chip integrated with the interconnect adapter. The chip amplifies signals to and from the head. According to a variation of the invention, the interconnect adapter mounts the signal pre-amplifier circuitry on the suspension, adjacent to the head assembly. This enables the chip to be placed closer to the head and be mounted at multiple locations to optimize head signal throughput.

Mounting the signal pre-amplifier circuitry adjacent to the head assembly amplifies signals to and from the head assembly to minimize magnetically induced interference with the head signals. This improves the signal-to-noise ratio of the head signal, increases bandwidth, and thus enables higher data transfer rates.

The interconnect adapter is removable from the suspension to enable the suspension assembly to be reworked during the disk drive assembly process. Rework may occur several times for any of a number of reasons. For example, rework can correct mechanical defects such as gram load, slider defects and stack attitude. Rework may also replace electrical defects. Accordingly, the interconnect adapter is designed to be removed and reconnected a number of times to enable rework.

According to one aspect of the invention, the interconnect adapter has a first end removable and connectable with the suspension assembly and a second end removable and connectable with read/write circuitry of the HSA. The head assembly includes head traces with termination pads. The first end of the interconnect adapter couples with the termination pads.

To achieve a removable connection, both ends of the interconnect adapter have a pad set with a plurality of pads. Each pad has a frame and multiple connection tabs. Only one connection tab is required to connect the interconnect adapter pad with termination pads of a single head assembly trace and read/write circuitry, respectively.

The tabs are individually severable from the frame to enable disconnection of the interconnect adapter pad from the trace termination pad. Severance of the tab from the frame enables removal of the interconnect adapter from the trace termination pad and facilitates reconnection of another trace to one of the other tabs.

BRIEF DESCRIPTION OF THE DRAWINGS

The invention will be described in greater detail with reference to the drawings in which.

DETAILED DESCRIPTION OF THE INVENTION

Figure 1:
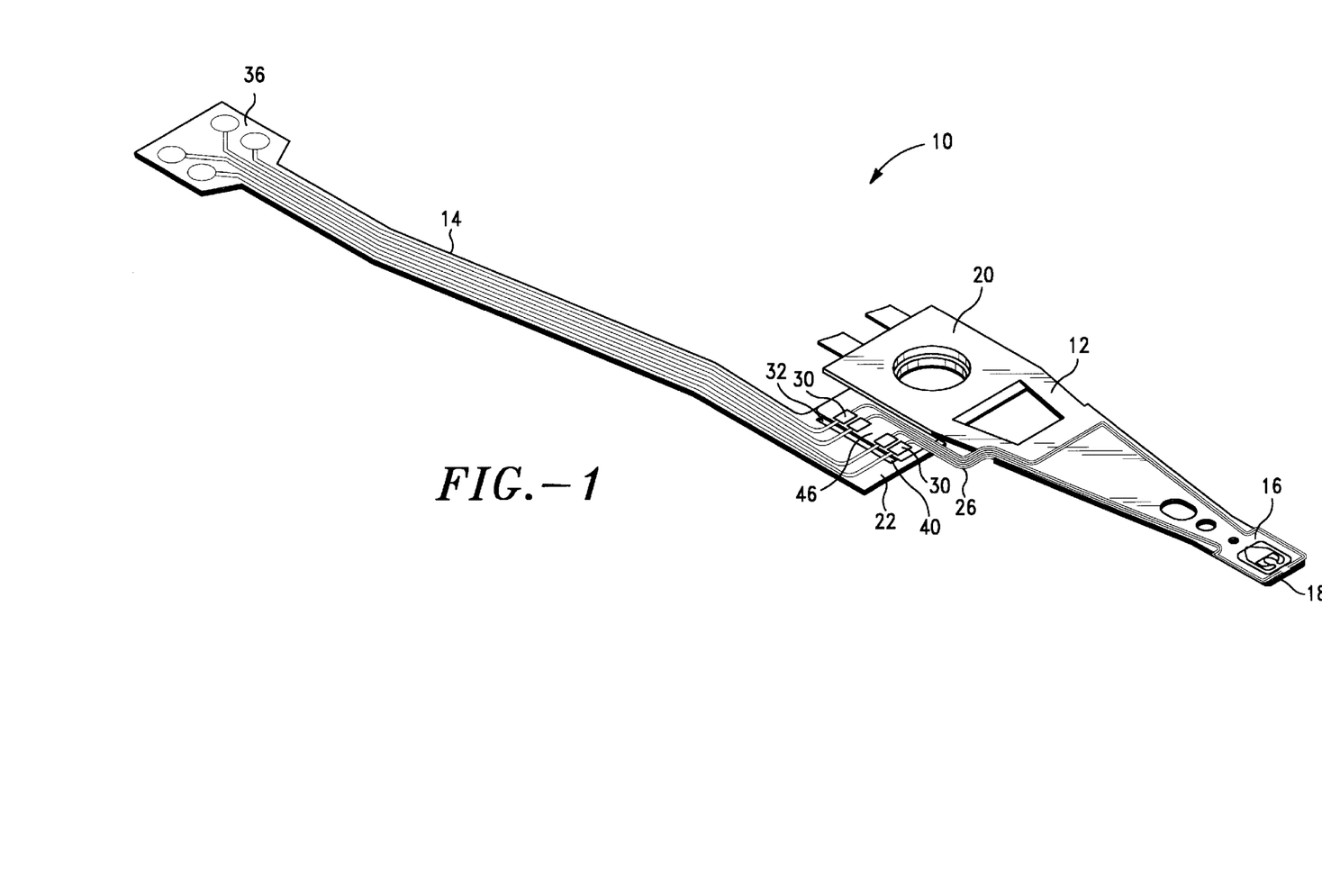
FIG. 1 is a perspective view of an interconnect adapter assembled with a wireless suspension assembly, in accordance with the present invention.

FIG. 1 shows a suspension assembly 10 that includes a load beam 12, having a first end 16 with a head assembly 18 and a second end 20. The second end 20 includes a shelf 22. An interconnect adapter 14 attaches to the shelf 22. The interconnect adapter 14 is flexible and particularly suited to couple the suspension assembly 10 with either front-end read/write circuitry, or to test circuitry.

The head assembly 18 includes a slider and a head. The head includes a read sensor and a write element. Head traces 26 extend from the read sensor and the write element, respectively. More particularly, the head traces 26 include two write traces and two read traces. Each read trace has a polarity corresponding to the head, as does each write trace.

Figure 2:
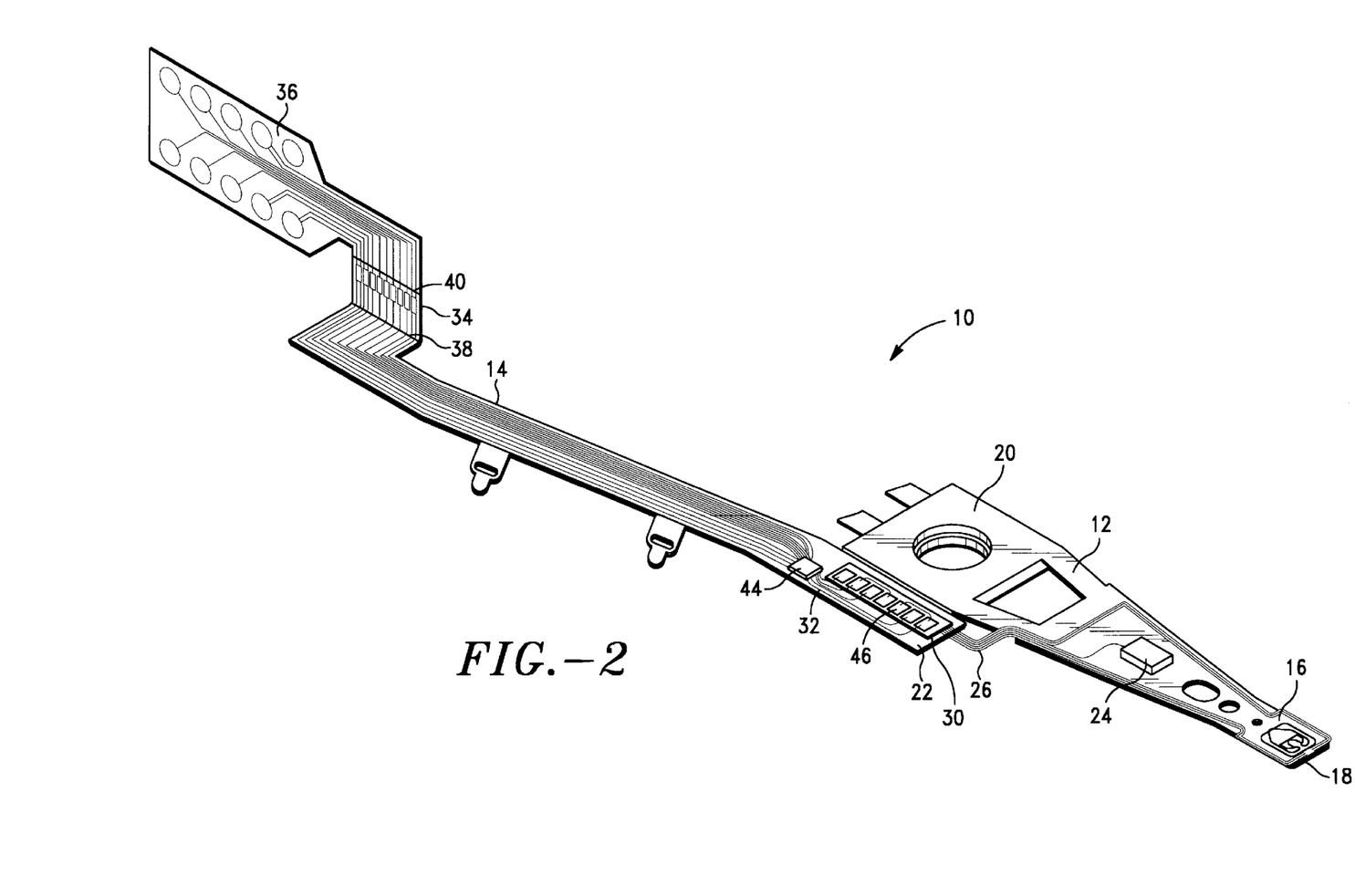
FIG. 2 is a perspective view of an interconnect adapter assembled with a suspension assembly, in accordance with the present invention.

The head traces 26 define termination pads 30. The termination pads 30 enable the head traces 26 to connect with the interconnect adapter 14. The interconnect adapter 14 includes two ends 32 and 34 (FIG. 2). The end 32 includes a pad set 46 that electronically couples to the termination pads 30 of the traces 26.

The end 34 of the interconnect adapter 14 includes a test pad set 36 that is attachable to suspension assembly test circuitry, or head assembly test circuitry, for example. The test pad set 36 is compatible with standard magnetic and electrical test systems. Accordingly, the interconnect adapter 14 adapts various head assembly configurations (i.e. polarity and pad set configurations) for testing with standard suspension assembly electronic test systems.

Although the test pad set 36 has four pads and is particularly adapted for testing two read and two write traces, the test pad set 36 can also be adapted for testing head positioning devices including piezoelectric microactuators. The test pad set 36 is also adaptable for testing signal processing elements including elements for optimizing data transfer rates to and from the head assembly 18.

The interconnect adapter 14 is formed from a flexible substrate tape with conductive elements. Preferably, the interconnect adapter 14 includes a cover layer, a copper conductive layer and a Kapton or polyimide layer, for example. The termination pads 30 are bonded to the load beam 12 shown in FIG. 10 and FIG. 11.

FIG. 2 shows the interconnect adapter 14 including an amplifier circuit including a packaged split pre-amplification chip 44 positioned on the shelf 22, near one end of the load beam 12. The amplifier circuit 44 is integrated at the end 32 of the interconnect adapter 14 to function with front-end read/write circuitry of the HSA. Although the split pre-amplifier chip 44 is positioned on the shelf 22 near the end 20 of the suspension, the chip 44 may be positioned elsewhere. For example, the chip 44 may also be adjacent to the head assembly 18 to minimize distance between the head assembly 18 and the chip 44 and to improve data transfer rates.

The load beam 12 has an integrated microactuator 24. The microactuator attaches to the load beam 12. The microactuator 24 includes a piezoelectric element that moves the load beam 12 to precisely position the head assembly 18 relative to a rotating disk during use.

The interconnect adapter 14 includes the pad set 46, the test pad set 36, a fold line 38 and a detach line 40 adjacent the end 34. The test pad set 36 enables HGA testing. The detach line 40 is severable. Slicing the detach line 40 enables test pad set 36 removal and enables installation of the adapter 14 and suspension assembly 10 in a hard disk drive after testing is completed, for example. Removal of the test pad set 36 exposes the end 34 to enable the end 34 of the interconnect adapter 14 to couple with front-end read/write circuitry. The test pad set 36 facilitates testing of the suspension assembly 10 prior to assembly in an HSA. The fold line 38 enables the end 34 of the interconnect adapter to attach to the lateral side of a Head Stack Assembly (HSA).

During assembly, the suspension assembly 10 is tested to assure targeted gram load, head assembly 18 alignment, and head assembly 18 operation. The suspension assembly 10 is reworked, as necessary, to replace mechanically and electrically defective components. On occasion, a suspension assembly is rejected during the process of assembling the suspension assembly 10 with a HSA. Removably attaching the adapter 14 to the suspension assembly 10 enables the suspension assembly 10 to be readily removed and replaced.

Figures 3, 4:
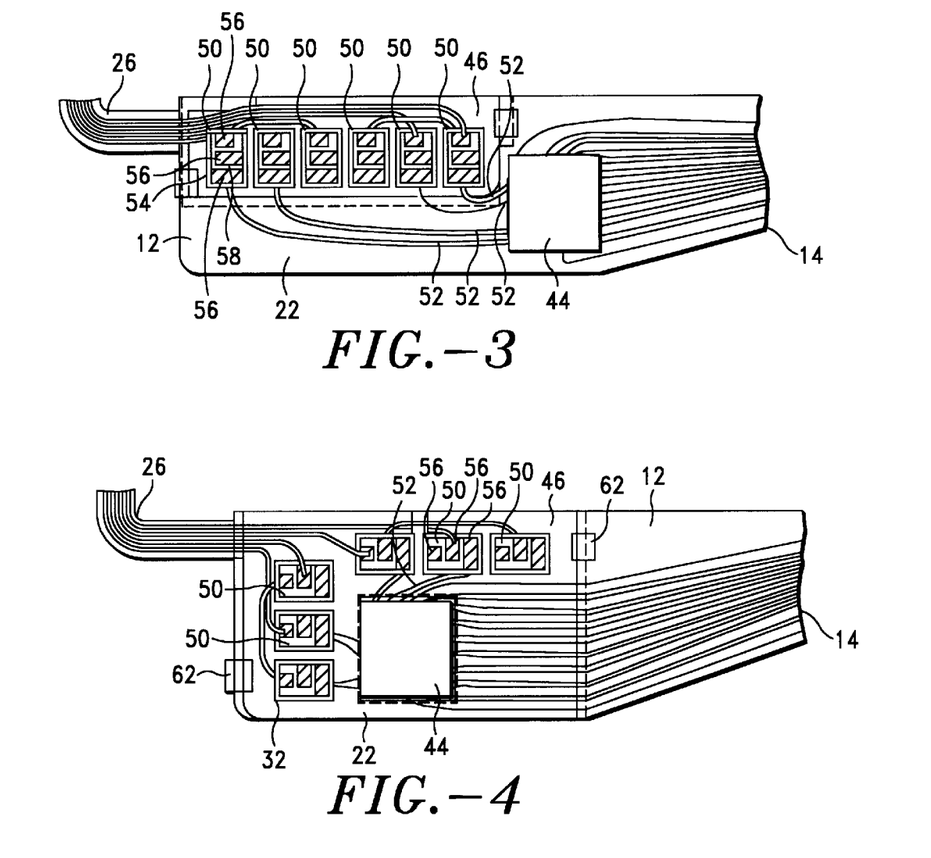
FIG. 3 is a top view of an embodiment of a pad set, in accordance with the present invention.
FIG. 4 is a top view of an alternative embodiment of a pad set, in accordance with the present invention.

FIG. 3 shows a pad set 46 coupled over the termination pads 30 of the head traces 26. One termination pad lies directly beneath each pad of the pad set 46. The pad set 46 placement can vary in configuration, as needed, according to the load beam geometry and amplifier chip 44 layout. According to one aspect of the invention, the pad set 46 includes six pads 50.

Each pad 50 includes a frame 54, and connection tabs 56. The frame 54 is rectangular in shape, having an inner periphery 58. The frame 54 surrounds the connection tabs 56. The connection tabs 56 cantilever, extending from the inner periphery 58.

Traces 52 couple the amplifier chip 44 to the frame 54 of each pad. Each frame 54 electronically couples with the tabs 56. The use of connection tabs 56 allows the pads 50 to be removed and replaced to facilitate reworks.

Figure 10:
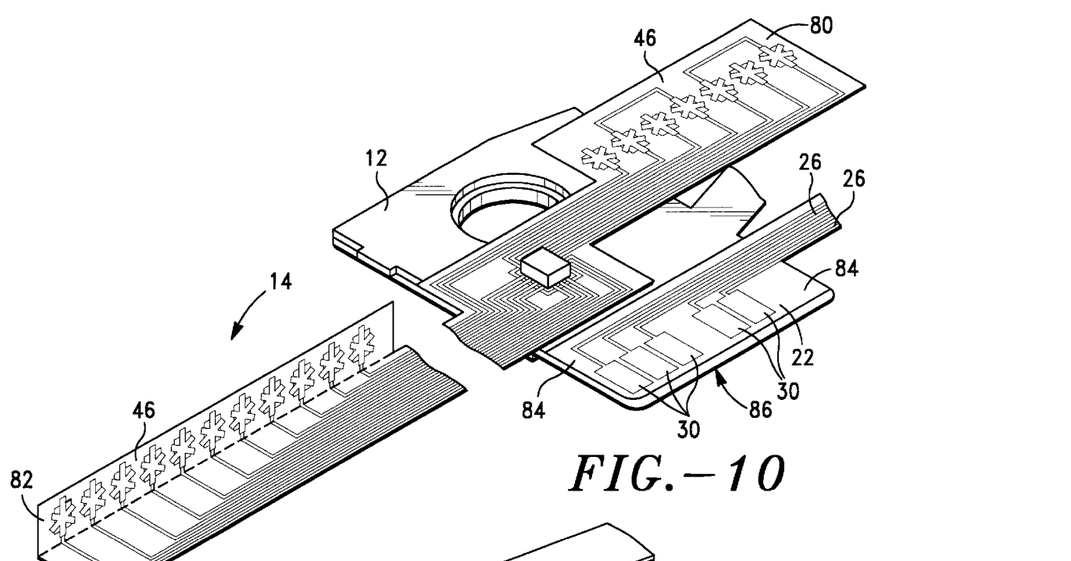
FIG. 10 is a perspective view in breakaway of an interconnect adapter exploded from a suspension topside.
Figure 11:
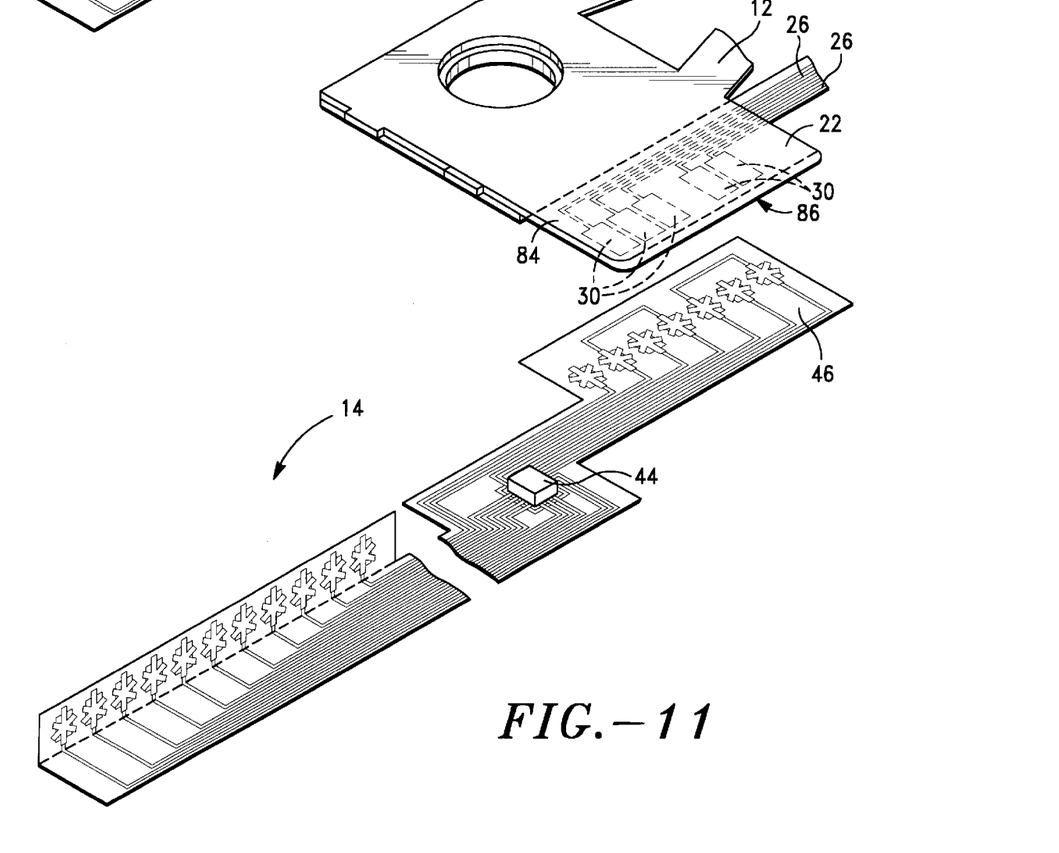
FIG. 11 is a perspective view in breakaway of an interconnect adapter exploded from a suspension bottom side.

One tab 56 of each pad 50 ultrasonically bond to the corresponding termination pads that underlie each pad 50. Each pad 50 disconnects from the corresponding termination pad when a laser, for example, is used to sever the tab 56 from the frame. The head traces 26 are reconnectable to the pad 50 by re-coupling one of the remaining tabs 56 to one of the termination pads. The termination pads 30 are shown in FIG. 10 and FIG. 11.

FIG. 4 shows a pad set 46. The pad set 46 includes two rows of pads 50, which align perpendicular to each other, along adjacent sides of the amplifier circuit 44. The pre-amp chip 44 and the pad set 46 are integrated on a substrate tape and do not 19 normally separate. The interconnect adapter 14, including the amplifier circuit 44 and pad set 46 are removably affixed to the shelf 22 with clips 62.

Figure 5:
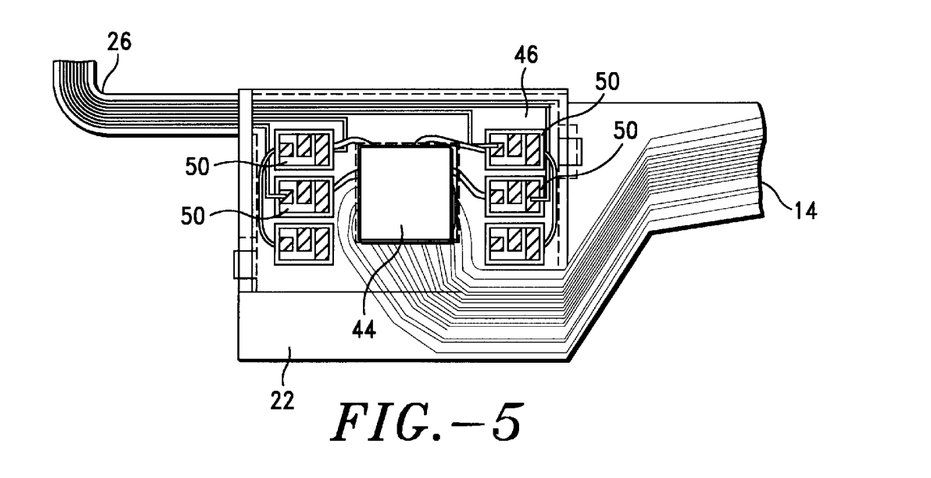
FIG. 5 is a top view of another embodiment of a pad set, in accordance with the present invention.

FIG. 5 shows a pad set 46 attached to the shelf 22. The pad set 46 includes two parallel rows of pads 50. The amplifier chip 44 is square, having opposing sides. The parallel rows of pads 50 align with the opposing sides of the amplifier circuit 44.

Figure 6:
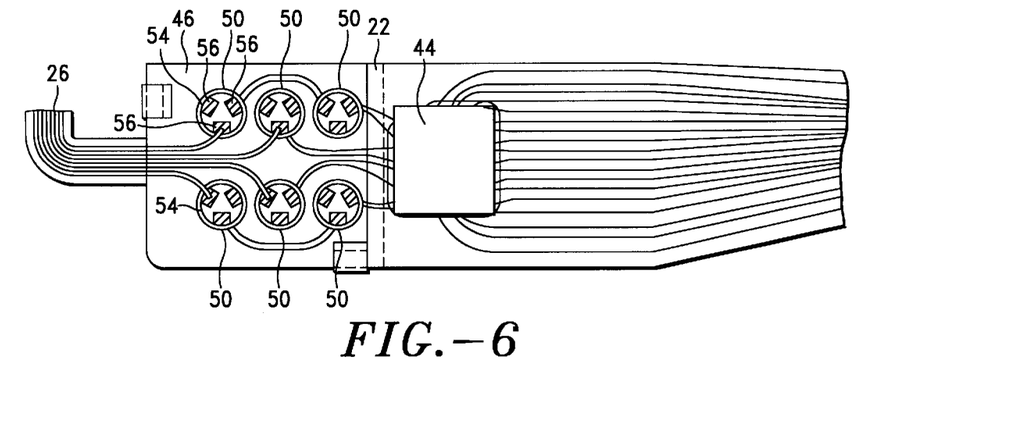
FIG. 6 is a top view of another embodiment of a pad set, in accordance with the present invention.
Figure 7A:
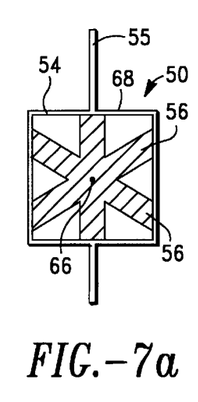
FIGS. 7a, 7b, 7c, 7d, and 7e are top views of pads, in accordance with the present invention.
Figure 7B:
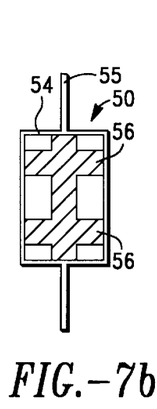
Figure 7C:
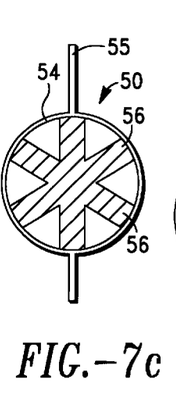
Figure 7D:
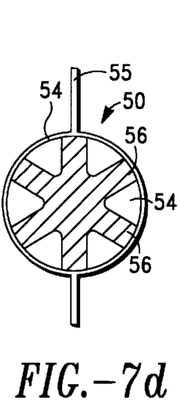
Figure 7E:
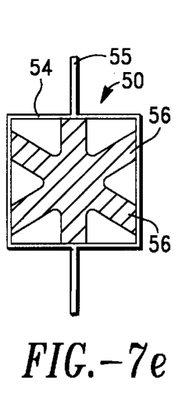

FIG. 6 shows the chip 44 attached to the load beam 12. The pad set 46 is separate from the chip 44 and attaches to the suspension shelf 22. The pad set 46 includes two parallel rows of pads 50. Each pad 50 has a round frame 54. The amplifier chip 44 is integrated in the interconnect adapter 14. The traces 26 from the head assembly 18 attach to a respective tab 56 of each pad 50 to removably couple with the pad set 46.

FIGS. 7a, 7b, 7c, 7d, and 7e show various pad 50 configurations in accordance with the present invention. The pads 50 each include a frame 54. The frame 54 is formed as part of the traces 55. The tabs 56 extend from the frame 54, and meet at a center point 66. Accordingly, the tabs 56 are integrated. The end 34 and the pad set 46 of the interconnect adapter 14 (FIG. 2) include pads 50.

The tabs 56 are each capable of bonding with traces (i.e. a trace termination pad) between the center point 66 and the frame 54. When a trace bonds with one of the tabs 56 of FIGS. 7a–7e, inclusive, two cuts are required to sever the tab 56. More particularly, one cut near the frame 54 and one cut near the center point 66 severs a single tab 56 from the frame 54.

Each pad 56 includes a copper trace with an integrated frame 54. Tabs 56 extend from the frame 54 and provide a bonding surface to enable the tabs 56 to ultrasonically bond with the termination pad 30 (FIG. 10). The tabs 56 are severable to selectively disconnect any tab from the frame 54. The tabs 56 are integrated so that the tabs 56 structurally support each other. Integrated tabs 56 connect to the frame 54 in more than one location, providing a reliable electronic coupling.

Figure 8A:
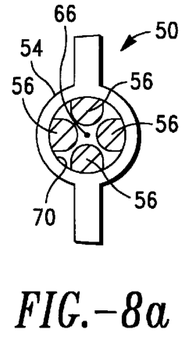
FIGS. 8a, 8b, 8c, 8d, 8e, 8f, 8g, 8h, and 8i are top views of other pads, in accordance with the present invention.

FIGS. 8a, 8b, 8c, 8d, 8e, 8f, 8g, 8h, and 8i depict various pads 50 in accordance with the present invention. The frame 54 is electrically conductive and surrounds the tabs 56. As shown in FIG. 8a, the frame 54 includes an inner periphery 70. The tabs 56 attach to the inner periphery 70 of the frame 54. The tabs 56 cantilever from the inner periphery 70 towards a center point 66. When a trace couples to a tab 56, a single cut severs the tab 56 to disconnect the tab 56 from the frame 54. An advantage of having cantilevered tabs 56 is that a single cut can sever each tab 56. The single cut is typically performed more easily and rapidly than multiple cuts.

Figure 8B:
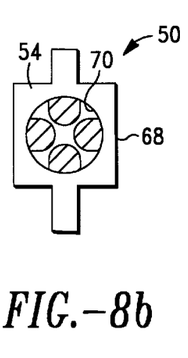
Figure 8C:
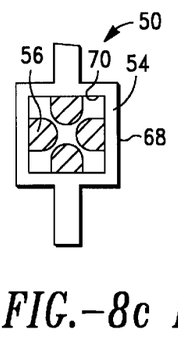

FIG. 8b shows the frame 54 having a rectangular outer periphery 68 and a circular inner periphery 70. FIG. 8c shows the frame 54 being square both on the inner periphery

Figure 8D:
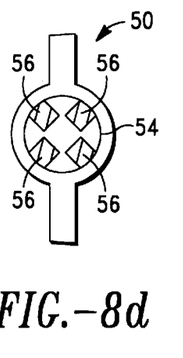
Figure 8E:
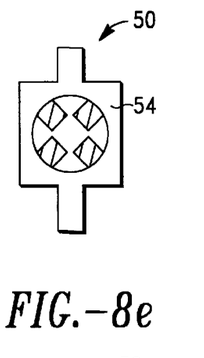
Figure 8F:
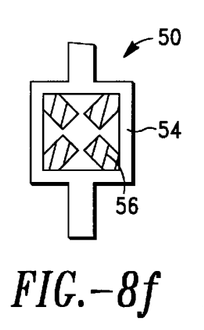
Figure 8G:
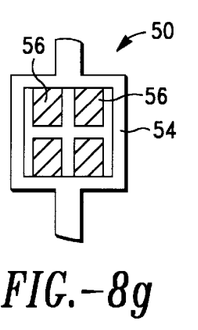
Figure 8H:
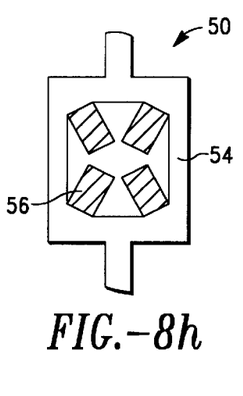
Figure 8I:
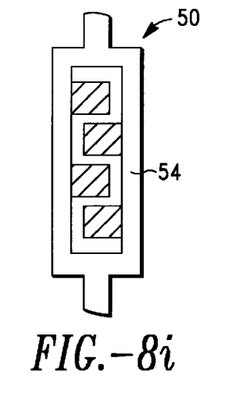

70 and on the outer periphery 68. The tabs 56 are rounded and one tab 56 extends from each side of the frame 54. FIG. 8d shows the frame 54 being round with square tabs 56. FIG. 8e shows two tabs 56 extending from opposing sides of the frame 54. FIG. 8f shows the frame 54 having a square inner periphery with corners. A tab 56 extends from each corner. FIG. 8h shows a square inner periphery with rectangular tabs 56. FIG. 8i shows a rectangular frame with two tabs extending from each lateral side. The tabs are staggered and align along the lateral sides.

Figure 9:
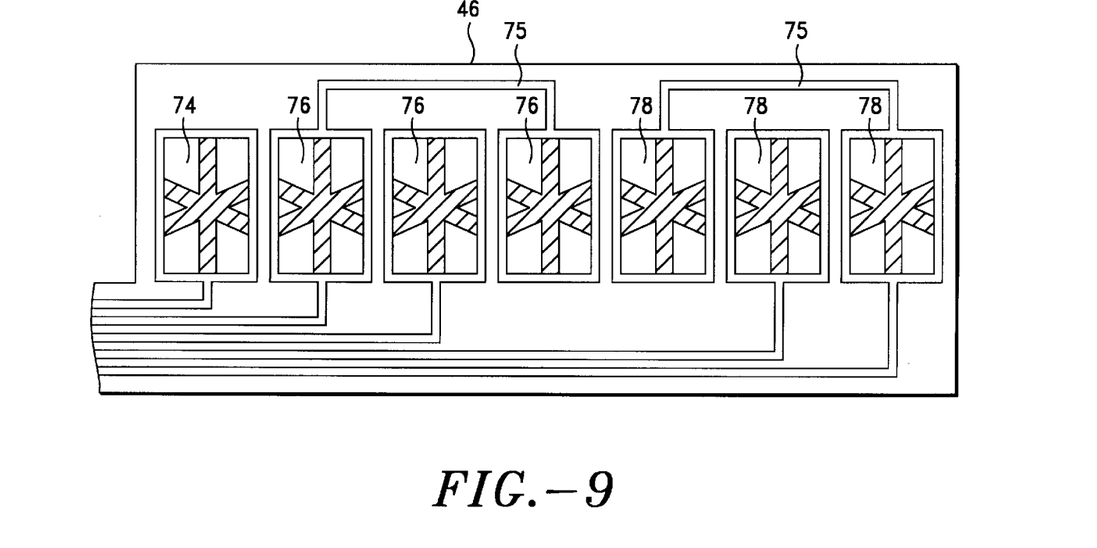
FIG. 9 is a pad set for communicating with a read/write head and a piezoelectric microactuator in accordance with the present invention.

FIG. 9 shows a pad set 46 for communicating with a read/write head and a microactuator 24 in accordance with the present invention. The pad set 46 includes seven pads. One pad 74 communicates with a piezoelectric motor element of the microactuator 24 (FIG. 2). The pads 76 and 78 communicate with the read/write elements of the head assembly 18.

Some of the pads 76 include jumpers 75. The jumpers 75 interconnect pairs of pads 76 to enable the pad set 46 to be adapted to various termination pad set configurations. It can be appreciated that the jumpers 75 enable the present invention to connect various head types with any of a number of commercially available read/write Integrated circuit (IC) configurations regardless of the polarity and layout discrepancies between the head and the read preamplifier/write driver circuit.

The six bonding pads 76 are defined as being negative, positive, negative, negative, positive, and negative, respectively. For example, the first three pads 76 serve as write leads if the last three pads 76 serve for reading or vice-versa. The jumpers 75 connect with two negative pads 76. One of the jumped pads 76 is a dummy. Having dummy pads jumped with active pads 76 enables the pad set to adapt to various polarity configurations.

FIG. 10 shows an interconnect adapter 14 exploded from a load beam 12 topside 84. The suspension includes a number of termination pads 30. Each termination pad 30 couples with a head trace 26.

The interconnect adapter 14 has two ends 80 and 82. A pad set 46 is formed on each end 80 and 82. The pad set 46 at the end 80 is gold plated on two sides to be capable of adapting to either the topside 84 of the load beam 12 as in FIG. 10 or the bottom side 86 of the load beam 12 as in FIG. 11.

The second end 82 of the interconnect adapter 14 includes a pad set 46 for coupling the interconnect adapter 14 to front-end read/write circuitry, or to circuit test equipment.

FIG. 11 shows the interconnect adapter 14 exploded from the bottom side 86 of the load beam 12. The interconnect adapter 14 is connectable to a suspension bottom side 86, or topside 84 without modification. The interconnect adapter 14 is universally connectable with respect to top and bottom sides of the load beam 12.

Known head assembly designs have a variety of trace 26 polarity characteristics. Termination pad set 30 configurations usually correspond to a particular head assembly 18 design. It can be appreciated that the interconnect adapter 14, and particularly the pad set 46, may be adapted to couple with any of a variety of termination pad set 30 configurations. The interconnect adapter 14 is also configurable to connect with any of a variety of front-end read/write circuitry designs. The interconnect adapter 14, the amplification circuit 44 and the pad set 46 cooperate to make a proper connection. Accordingly, the cooperation of the interconnect adapter 14, the split pre-amplification chip 44 and the pad set 46 enables the present invention to be adapted for use with many different suspension assemblies.

Figure 12:
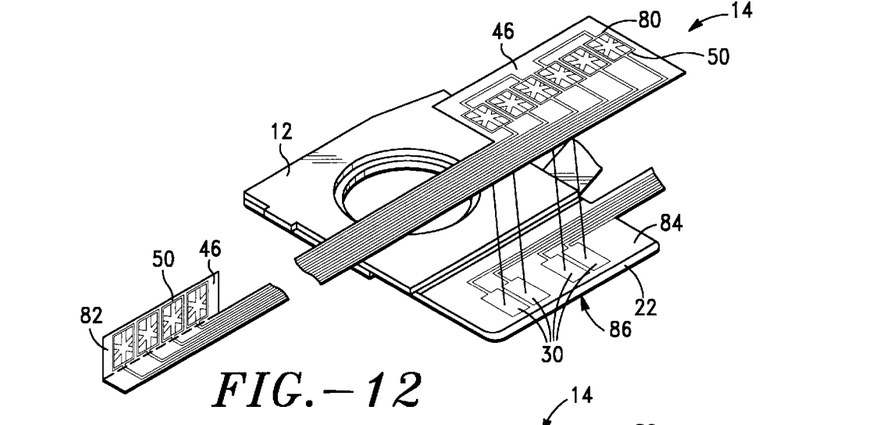
FIG. 12 is a perspective view of an interconnect adapter and a suspension.
Figure 13:
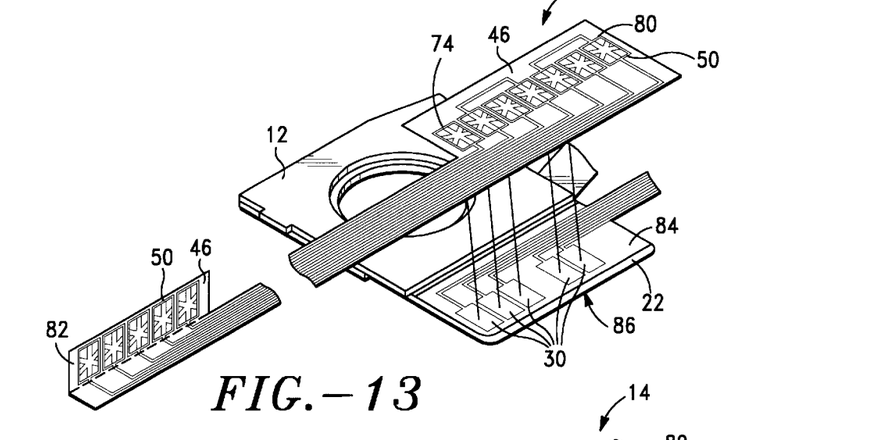
FIG. 13 is a perspective view of an interconnect adapter having an additional pad for interconnection with a piezoelectric microactuator.
Figure 14:
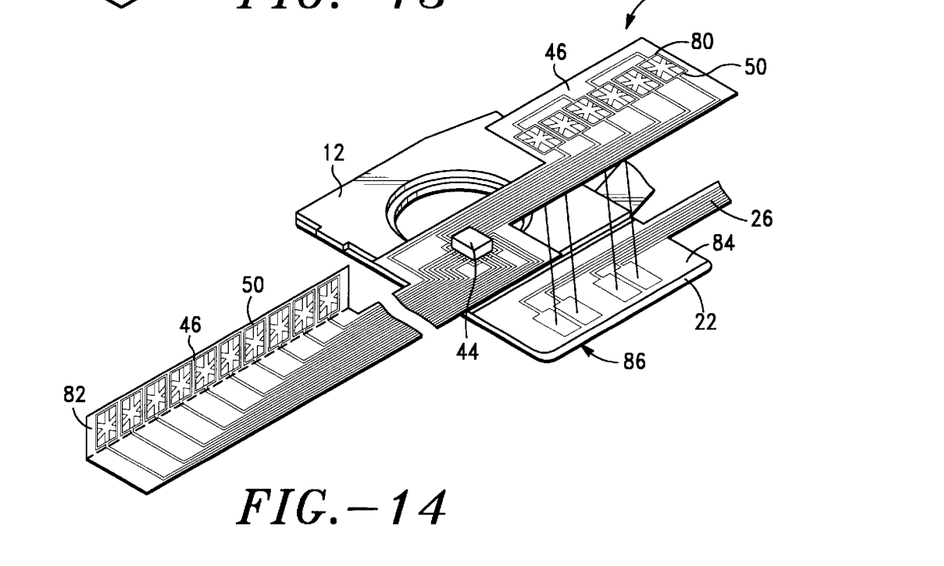
FIG. 14 is a perspective view of an interconnect adapter having a split preamplifier chip.

FIG. 12, FIG. 13 and FIG. 14 provide examples of various interconnect adapter 14 schemes having pad set configurations to adapt wireless suspension assemblies. The pad sets 46 are useful for connection not only with read/write circuitry, but also to microactuator closed loop circuits and to split pre-amplification circuits.

FIG. 12 shows the end 80 of the interconnect adapter having a pad set 46 with six pads. Four of the six pads align with and couple with the platform 22, leaving two unused pads. The unused pads enable the interconnect adapter 14 to function as an adapter which is capable of connection with alternate platform 22 configurations. The end 82 includes four pads for connection to read/write circuitry.

FIG. 13 shows the end 80 of the interconnect adapter 14 having seven pads. The pad 74 powers a microactuator 24 (FIG. 2). The load beam 12 grounds the microactuator 24. The adapter end 82 has four pads for connection of the head to read/write circuitry, and one pad for connection of the microactuator to the read/write circuitry.

FIG. 14 shows the end 80 of the interconnect adapter 14 having six pads. The interconnect adapter 14 includes the split pre-amplification chip 44. The chip 44 pre-amplifies signals from the head traces 26 to achieve higher data transfer rates from the head assembly 18.

The adapter end 82 includes a pad set 46 with ten pads. The ten pads enable the split pre-amplification chip 44 and the head traces 26 to communicate with the read/write circuitry.

Figure 15:
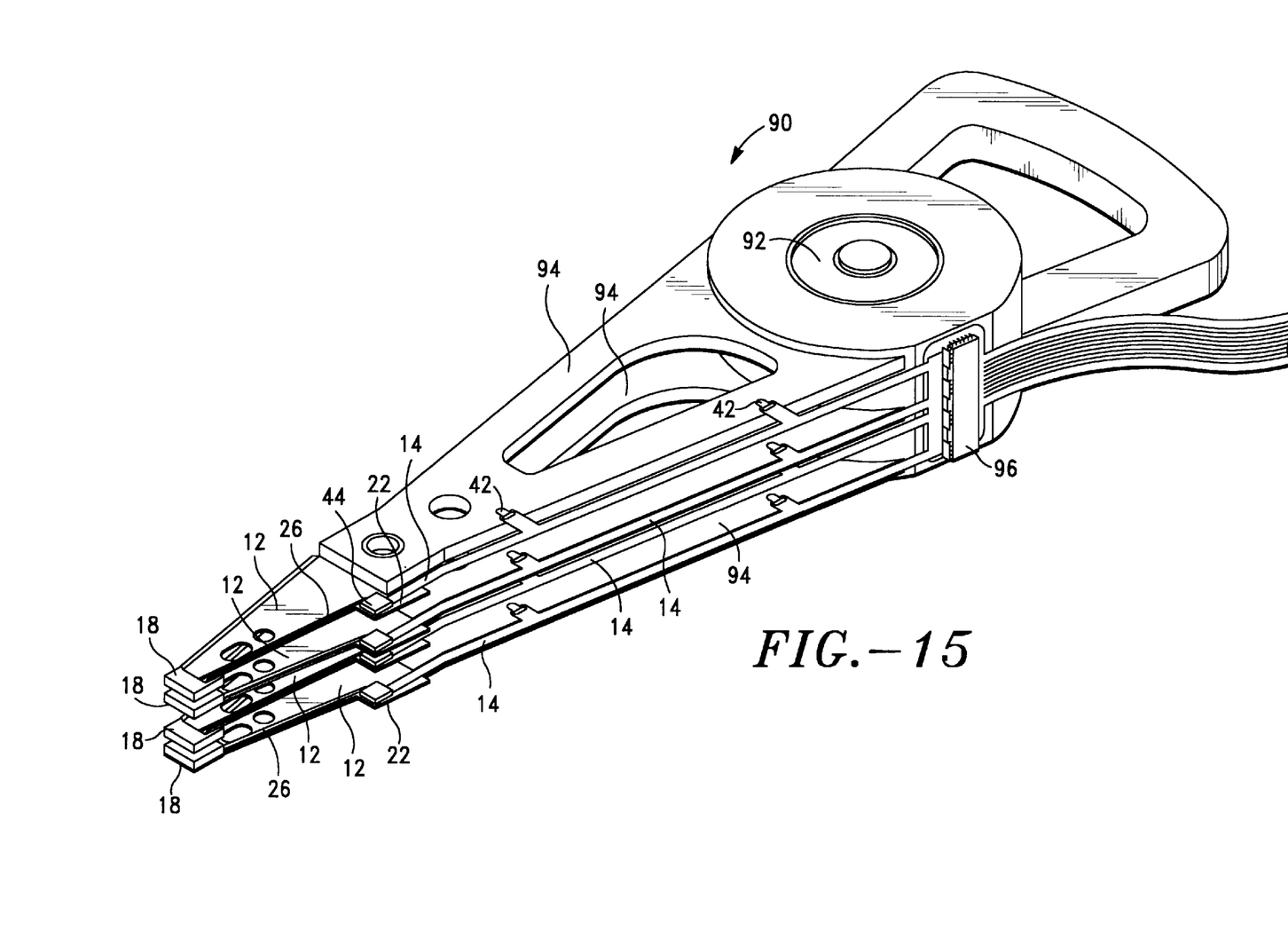
FIG. 15 is a perspective view of the interconnect adapter of the present invention extending between a suspension assembly and an E-block of a HSA.

FIG. 15 shows an E-block assembly 90 including a pivot bearing 92 and actuator arms 94. Each actuator arm 94 attaches to a load beam 12. Each load beam 12 supports a slider with a head assembly 18. The actuator arms 94 are formed with the E-block assembly 90. The E-block assembly 90 pivots on the pivot bearing 92 to move the heads 18 relative to a disk surface.

Each load beam 12 carries read/write traces 26. One end of each lead 26 couples with the head assembly 18, and another end connects with the interconnect adapter 14. The interconnect adapter 14 includes the pre-amp chip 44.

The E-block 90 includes read/write circuitry 96 for regulating head assembly 18 operation. The interconnect adapter 14 extends between the shelf 22 and the read/write circuitry 96 and electronically couples head traces 26 to the read/write circuitry 96. Removal of the traces 26 from the interconnect adapter 14 at the shelf 22 enables removal of the suspension assembly.

The interconnect adapter 14 may be equipped with a pad set 46 to connect to read/write circuitry 96 to enable removal and replacement of the interconnect adapter 14 from the read/write circuitry 96.

It should be understood that various features may be modified in accordance with the present invention. For example, the configuration of the pads 50 may change. Additionally the location of the shelf 22 on the load beam 12 may be moved. Further, the read/write circuitry 96 of the E-block 90 may be relocated. The location of the split pre-amplifier chip 44 may be moved. The microactuator 24 may also be repositioned, or replaced with some type of microactuator other than a piezoelectric-type actuator.

What is claimed is:

1. A suspension assembly having an interconnect adapter for removably coupling the suspension assembly with read/write circuitry comprising:

a suspension assembly having a load beam, a head assembly attached to the load beam and traces extending from the head assembly, the traces defining termination pads; and an interconnect adapter having a first end connectable with the termination pads and a second end connectable with the read/write circuitry, the first end of the interconnect adapter having a pad set with a plurality of pads, each pad having a frame and tabs, each tab being connectable to the termination pad;

wherein the tabs are individually severable from the frame to enable removal of the interconnect adapter from the termination pads.

2. A suspension assembly as set forth in claim 1, wherein the pad set has at least four functional pads, a plurality of jumpers, and two dummy pads, wherein the jumpers couple each dummy pad to a functional pad to enable the adapter to couple with termination pads of any of a number of polarity configurations.

3. A suspension assembly as set forth in claim 3, wherein jumpers interconnect to the frames of the functional pads and the dummy pads.

4. A suspension assembly as set forth in claim 1, wherein interconnect adapter includes a split pre-amplifier chip.

5. A suspension assembly as set forth in claim 3, wherein the frame defines a center, and the tabs cantilever from the frame and meet at the center.

6. A suspension assembly as set forth in claim 3, wherein the frame is rectangular in shape, having an inner periphery with four sides, and one functional tab extends from each side.

7. A suspension assembly as set forth in claim 3, wherein the frame is square, having four corners, and one functional tab extends from each corner.

8. A suspension assembly as set forth in claim 3, wherein the frame is round, having an inner periphery, and at least three functional tabs extends from the inner periphery.

9. A suspension assembly as set forth in claim 1, wherein the pad set of said interconnect adapter has two connection surfaces to enable attachment of the interconnect adapter to either a suspension having a topside connection or to a suspension having a bottom side connection.

10. A suspension assembly as set forth in claim 9, wherein the connection surfaces are gold plated.

11. An interconnect adapter having a removable test pad and being removably attachable to a suspension assembly comprising:

a first end having a pad set, the pad set having a plurality of pads, each pad defining a frame and tabs extending from the frame;

wherein the tabs are individually severable from the frame to facilitate removal of the interconnect adapter from the suspension assembly;

a second end having a test pad to enable the interconnect adapter to be tested; and a detach line defined between the first end and second end to enable removal of the test pad.

12. An interconnect adapter as set forth in claim 11, wherein the detach line is adjacent to the first end.

13. An interconnect adapter as set forth in claim 11, wherein the detach line is adjacent to the test pad.

14. An interconnect adapter as set forth in claim 11, wherein the second end has a pad set having pads with a frame and tabs.

15. A suspension assembly having an interconnect adapter for removably coupling the suspension assembly to read/write circuitry comprising:

a load beam;

a head assembly attached to the load beam;

traces extending from the head assembly defining termination pads;

an interconnect adapter having a first end connectable with the termination pads and a second end connectable with the read/write circuitry;

the first end of the interconnect adapter having a pad set with a plurality of pads, each pad having a frame and tabs, each tab being connectable to the termination pad;

wherein the tabs are individually severable from the termination pads to enable removal of the interconnect adapter from the termination pads; and the second end of the interconnect adapter having a pad set with a plurality of pads, each pad having a frame and tabs, and the tabs are individually severable.

16. A suspension assembly as set forth in claim 15, wherein the interconnect adapter includes pre-amplification circuitry.

17. A suspension assembly as set forth in claim 15, wherein the interconnect adapter includes a split pre-amplification chip.

18. A suspension assembly as set forth in claim 15, wherein the first end includes a pair of pad sets and a split pre-amplification chip, having opposing sides, the pad sets being parallel to the opposing sides.

19. A suspension assembly as set forth in claim 15, wherein the first end includes a pair of pad sets and a split pre-amplification chip, wherein the pair of pad sets align perpendicular to each other.

20. A suspension assembly as set forth in claim 15, wherein the pad set includes a pad for connection with a microactuator.

* * * * *